(12) United States Patent
Kwan et al.

(10) Patent No.: US 7,589,921 B2
(45) Date of Patent: Sep. 15, 2009

(54) ACTUATOR DEVICE

(75) Inventors: Yim-Bun Patrick Kwan, Aalen (DE); Stefan Xalter, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/844,232

(22) Filed: Aug. 23, 2007

(65) Prior Publication Data

US 2009/0052066 A1    Feb. 26, 2009

(51) Int. Cl.
*G02B 27/00* (2006.01)
(52) U.S. Cl. .................. 359/823; 359/822; 359/824
(58) Field of Classification Search ......... 359/694–701, 359/819–824
See application file for complete search history.

(56) References Cited

U.S. PATENT DOCUMENTS 5,822,133 A * 10/1998 Mizuno et al. .............. 359/696
7,113,351 B2 * 9/2006 Hovanky .................... 359/824
7,460,320 B2 * 12/2008 Onuki et al. ................ 359/824

* cited by examiner

*Primary Examiner*—Mohammed Hasan
(74) *Attorney, Agent, or Firm*—Fish & Richardson P.C.

(57) ABSTRACT

Actuator devices, as well as related systems and methods, are disclosed. In some embodiments, the devices, systems and methods are within the field of microlithography. In some embodiments, a system can include an optical element unit having an optical element, a support structure supporting the optical element, and an actuator device connected to the optical element and configured to exert an actuation force onto the optical element along a direction of actuation. The actuator device can include an actuation unit which includes a linking section that links first and second sections of the actuation unit.

38 Claims, 5 Drawing Sheets

ACTUATOR DEVICE

FIELD

The disclosure relates to actuator devices, as well as related systems and methods. In some embodiments, the devices, systems and methods are within the field of microlithography.

BACKGROUND

Typically, the optical systems used in the context of fabricating microelectronic devices such as semiconductor devices include a plurality of optical element modules including optical elements, such as lenses, mirrors, gratings etc., in the light path of the optical system. Those optical elements usually cooperate in an exposure process to illuminate a pattern formed on a mask, reticle or the like and to transfer an image of this pattern onto a substrate such as a wafer. The optical elements are usually combined in one or more functionally distinct optical element groups that may be held within distinct optical element units.

With such optical systems, typically, such optical element units are often built from a stack of optical element modules holding one or more—typically but not necessarily rotationally symmetric—optical elements. These optical element modules usually include an external generally ring shaped support structure supporting one or more optical element holders each, in turn, holding one or more optical elements.

SUMMARY

In one aspect, the disclosure generally features an actuator device that includes an actuation unit that defines an actuator axis and a direction of actuation along the actuator axis. The actuation unit is adapted to receive an actuation energy defining an actuation force exerted by the actuator device along the direction of actuation. The actuation unit includes a first section which, in a neutral state of the actuation unit, has a first axial rigidity along the direction of actuation and a first transverse rigidity transverse to the direction of actuation. The actuation unit also includes a second section which, in the neutral state of the actuation unit, has a second axial rigidity along the direction of actuation and a second transverse rigidity transverse to the direction of actuation. The actuation unit further includes a linking section that links the first and second sections. The linking section, in the neutral state of the actuation unit, has a third axial rigidity along the direction of actuation and a third transverse rigidity transverse to the direction of actuation. The third axial rigidity is smaller than at least one of the first and second axial rigidities and/or the third transverse rigidity is smaller than at least one of the first and second transverse rigidities.

In another aspect, the disclosure generally features an optical element unit that includes an optical element and a support structure supporting the optical element. The support structure includes at least one actuator device connected to the optical element and configured to exert an actuation force onto the optical element along a direction of actuation. The at least one actuator device includes an actuation unit defining an actuator axis and a direction of actuation along the actuator axis. The actuation unit is adapted to receive an actuation energy defining an actuation force exerted by the actuator device along the direction of actuation. The actuation unit includes a first section which, in a neutral state of the actuation unit, has a first axial rigidity along the direction of actuation and a first transverse rigidity transverse to the direction of actuation. The actuation unit also includes a second section which, in the neutral state, has a second axial rigidity along the direction of actuation and a second transverse rigidity transverse to the direction of actuation. The actuation unit further includes a linking section that links the first and second sections. The linking section, in the neutral state, has a third axial rigidity along the direction of actuation and a third transverse rigidity transverse to the direction of actuation. The third axial rigidity is smaller than at least one of the first axial rigidity and the second axial rigidity, and/or the third transverse rigidity is smaller than at least one of the first transverse rigidity and the second transverse rigidity.

In a further aspect, the disclosure generally features an actuator device that includes an actuation chamber defining an actuator axis and a direction of actuation along the actuator axis. The actuation chamber is adapted to receive an actuation fluid having an actuation pressure. The actuation pressure defines an actuation force exerted by the actuator device along the direction of actuation. The actuation chamber is at least partially confined by at least one wall element. The at least one wall element includes a first wall section and a second wall section. At least one of the first and second wall sections is at least partially shaped in the manner of a bellows. The second wall section, at least in a neutral state of the actuator device, is arranged in a nested manner within the first wall section so as to define a ring shaped chamber section of the actuation chamber.

In an additional aspect, the disclosure generally features an optical element unit that includes an optical element and a support structure supporting the optical element. The support structure includes at least one actuator device connected to the optical element and configured to exert an actuation force onto the optical element along a direction of actuation. The at least one actuator device includes an actuation chamber defining an actuator axis and the direction of actuation along the actuator axis. The actuation chamber is configured to receive an actuation fluid having an actuation pressure. The actuation pressure defines an actuation force exerted by the actuator device along the direction of actuation. The actuation chamber is at least partially confined by at least one wall element. The at least one wall element includes a first wall section and a second wall section. At least one of the first wall section and the second wall section is at least in part shaped in the manner of a bellows. The second wall section, at least in a neutral state of the actuator device, is arranged in a nested manner within the first wall section so as to define a ring shaped chamber section of the actuation chamber.

In one aspect, the disclosure generally features a method that includes providing a component and a support structure supporting the component. The support structure includes at least one actuator device connected to the component. The at least one actuator device includes an actuation unit. The actuation unit defines an actuator axis and a direction of actuation along the actuator axis. The actuation unit includes a first section, a linking section and a second section. The linking section links the first section and the second section. The first section, in a neutral state of the actuation unit, has a first axial rigidity along the direction of actuation and a first transverse rigidity transverse to the direction of actuation. The second section, in the neutral state, has a second axial rigidity along the direction of actuation and a second transverse rigidity transverse to the direction of actuation. The linking section, in the neutral state, has a third axial rigidity along the direction of actuation and a third transverse rigidity transverse to the direction of actuation. The third axial rigidity is smaller than at least one of the first axial rigidity and the second axial rigidity, and/or the third transverse rigidity is smaller than at least one of the first transverse rigidity and the second transverse rigidity. The method also includes providing an actuation energy to the actuation unit, the actuation energy defining an actuation force exerted by the actuator device along a direction of actuation along the actuator axis onto the component.

In another aspect, the disclosure generally features a method that includes providing a component and a support structure supporting the component. The support structure includes at least one actuator device connected to the component. The at least one actuator device includes an actuation chamber. The actuation chamber defines an actuator axis and being at least partially confined by at least one wall element. The at least one wall element includes a first wall section and a second wall section. At least one of the first wall section and the second wall section is at least in part shaped in the manner of a bellows. The second wall section, at least in a neutral state of the actuator device, is arranged in a nested manner within the first wall section so as to define a ring shaped chamber section of the actuation chamber. The method also includes providing an actuation fluid to the actuation chamber. The actuation fluid has an actuation pressure. The actuation pressure defines an actuation force exerted by the actuator device along a direction of actuation along the actuator axis onto the component.

In a further aspect, the disclosure features a method that includes providing and connecting a first wall section of a wall element and a second wall section of the wall element. At least one of the first and second wall sections is at least in part shaped in the manner of a bellows. The first wall section and the second wall section are connected such that the second wall section is arranged in a nested manner within the first wall section so as to define a ring shaped chamber section of an actuation chamber at least partially confined by the wall element.

In an additional aspect, the disclosure generally features an actuator device that includes an actuation unit defining an actuator axis and a direction of actuation along the actuator axis. In a neutral state of the actuator device, it has an actuation unit length along the actuator axis. The actuation unit is adapted to receive an actuation energy. The actuation energy defines an actuation force exerted by the actuator device along the direction of actuation. The actuation unit includes a first section, a second section and a linking section that links the first and second section. The linking section, at least in the neutral state, is folded back along the actuator axis such that the actuation unit has an effective length along the actuator axis that corresponds at least to 140% of the actuation unit length.

In one aspect, the disclosure generally features an actuator device that includes an actuation chamber defining an actuator axis and a direction of actuation along the actuator axis and, in a neutral state of the actuator device, has a chamber length along the actuator axis. The actuation chamber is adapted to receive an actuation fluid having an actuation pressure. The actuation pressure defines an actuation force exerted by the actuator device along the direction of actuation. The actuation chamber is at least partially confined by at least one wall element. The at least one wall element includes a first wall section and a second wall section. The second wall section, at least in the neutral state, is arranged in a nested manner within the first wall section such that the at least one wall element has an effective length along the actuator axis that corresponds at least to 120% of the chamber length.

The present disclosure can provide an actuator device with relatively high flexibility in the adjustment of the axial and/or transverse rigidity of the actuator device at given geometric boundary conditions.

The present disclosure can provide an actuator device having a relatively high range of displacement even at narrow geometric boundary conditions in its fully retracted state while at the same time keeping the axial and/or transverse rigidity of the actuator device low over a the entire range of displacement.

The present disclosure can provide a relatively simple to use and/or design optical device used in an exposure process for at least maintaining the imaging accuracy during operation of the optical device.

In some embodiments, a higher flexibility in the adjustment of the axial and/or transverse rigidity the actuator device at given geometric boundary conditions may be achieved by increasing the effective length of the actuation unit along the actuator axis. It is possible to adjust the axial and/or transverse rigidity of the actuator device by simply modifying the effective length of the actuation unit. An increase in the effective length may be achieved by folding back a linking section of the actuation unit linking a first and second section of the actuation unit along the actuator axis such that the first and second section of the actuation unit overlap along the actuator axis.

If a fluidic actuation principle can be used, a higher flexibility in the adjustment of the axial and/or transverse rigidity the actuator device at given geometric boundary conditions may be achieved by increasing the effective length along the actuator axis of the at least one wall element confining the actuation chamber. It is possible to adjust the axial and/or transverse rigidity of the actuator device by simply modifying the effective length of the at least one wall element confining the actuation chamber. Furthermore, an increase in this effective length provides an increased range of displacement at a lower variation of the axial and/or transverse rigidity of the actuator device over the range of displacement since, due to the increased effective length, at a given range of displacement, the corrugations of the at least one wall element can be less straightened than in the known actuator devices leading to (if any) a lower increase in the axial and/or transverse rigidity of the actuator device.

At given geometric boundary conditions in the fully retracted state of the actuator device, it is possible to achieve a higher range of displacement while at the same time keeping the axial and/or transverse rigidity of the actuator device low. Thus, due to this low axial and/or transverse rigidity lower parasitic loads can be introduced into the optical system leading to a lower amount of imaging errors resulting from such parasitic loads introduced into the optical system.

An increase in the effective length of the actuation unit can be achieved by folding back at least one part of the actuator into itself such that at least one section of the actuator is arranged in a nested manner within another section of the actuator.

If a fluidic actuation principle is used, the increase in the effective length of the at least one wall element confining the actuation chamber can be achieved by folding back the at least one wall element into itself such that at least one wall section of the at least one wall element is arranged in a nested manner within another wall section of the at least one wall element, both sections then defining a ring shaped section of the actuation chamber.

In some embodiments, an actuator device includes an actuation unit, the actuation unit defining an actuator axis and a direction of actuation along the actuator axis. The actuation unit is adapted to receive an actuation energy defining an actuation force exerted by the actuator device along the direction of actuation. The actuation unit includes a first section, a linking section and a second section, the linking section linking the first section and the second section. The first section, in a neutral state of the actuation unit, has a first axial rigidity along the direction of actuation and a first transverse rigidity transverse to the direction of actuation. The second section, in the neutral state, has a second axial rigidity along the direction of actuation and a second transverse rigidity transverse to the direction of actuation. The linking section, in the neutral state, has a third axial rigidity along the direction of actuation and a third transverse rigidity transverse to the direction of actuation. At least one of the third axial rigidity is smaller than at least one of the first axial rigidity and the second axial rigidity, and the third transverse rigidity is smaller than at least one of the first transverse rigidity and the second transverse rigidity.

In certain embodiments, an optical element unit includes an optical element and a support structure supporting the optical element, the support structure including at least one actuator device connected to the optical element and exerting an actuation force onto the optical element along a direction of actuation. The at least one actuator device includes an actuation unit defining an actuator axis and a direction of actuation along the actuator axis, the actuation unit being adapted to receive an actuation energy defining an actuation force exerted by the actuator device along the direction of actuation. The actuation unit includes a first section, a linking section and a second section, the linking section linking the first section and the second section. The first section, in a neutral state of the actuation unit, has a first axial rigidity along the direction of actuation and a first transverse rigidity transverse to the direction of actuation. The second section, in the neutral state, has a second axial rigidity along the direction of actuation and a second transverse rigidity transverse to the direction of actuation. The linking section, in the neutral state, has a third axial rigidity along the direction of actuation and a third transverse rigidity transverse to the direction of actuation. At least one of the third axial rigidity is smaller than at least one of the first axial rigidity and the second axial rigidity, and the third transverse rigidity is smaller than at least one of the first transverse rigidity and the second transverse rigidity.

In some embodiments, an actuator device includes an actuation chamber. The actuation chamber defines an actuator axis and a direction of actuation along the actuator axis. The actuation chamber is adapted to receive an actuation fluid having an actuation pressure, the actuation pressure defining an actuation force exerted by the actuator device along the direction of actuation. The actuation chamber is at least partially confined by at least one wall element, the at least one wall element including a first wall section and a second wall section, at least one of the first wall section and the second wall section being at least partially shaped in the manner of a bellows. The second wall section, at least in a neutral state of the actuator device, is arranged in a nested manner within the first wall section so as to define a ring shaped chamber section of the actuation chamber.

In certain embodiments, an optical element unit includes an optical element and a support structure supporting the optical element. The support structure includes at least one actuator device connected to the optical element and exerting an actuation force onto the optical element along a direction of actuation. The at least one actuator of device includes an actuation chamber, the actuation chamber defining an actuator axis and the direction of actuation along the actuator axis. The actuation chamber receives an actuation fluid having an actuation pressure, the actuation pressure defining an actuation force exerted by the actuator device along the direction of actuation. The actuation chamber is at least partially confined by at least one wall element, the at least one wall element including a first wall section and a second wall section, at least one of the first wall section and the second wall section at least in part being shaped in the manner of a bellows. The second wall section, at least in a neutral state of the actuator device, is arranged in a nested manner within the first wall section so as to define a ring shaped chamber section of the actuation chamber.

In some embodiments, a method of exerting a force onto a component of an optical device includes, in a first step, providing the component and a support structure supporting the component, the support structure including at least one actuator device connected to the component, the at least one actuator device including an actuation unit, the actuation unit defining an actuator axis and a direction of actuation along the actuator axis, the actuation unit including a first section, a linking section and a second section, the linking section linking the first section and the second section; the first section, in a neutral state of the actuation unit, having a first axial rigidity along the direction of actuation and a first transverse rigidity transverse to the direction of actuation; the second section, in the neutral state, having a second axial rigidity along the direction of actuation and a second transverse rigidity transverse to the direction of actuation; and the linking section, in the neutral state, having a third axial rigidity along the direction of actuation and a third transverse rigidity transverse to the direction of actuation; at least one of the third axial rigidity being smaller than at least one of the first axial rigidity and the second axial rigidity, and the third transverse rigidity being smaller than at least one of the first transverse rigidity and the second transverse rigidity. The method further includes, in a second step, providing an actuation energy to the actuation unit, the actuation energy defining an actuation force exerted by the actuator device along a direction of actuation along the actuator axis onto the component.

In certain embodiments, a method of exerting a force onto a component of an optical device includes, in a first step, providing the component and a support structure supporting the component, the support structure including at least one actuator device connected to the component, the at least one actuator device including an actuation chamber, the actuation chamber defining an actuator axis and being at least partially confined by at least one wall element, the at least one wall element including a first wall section and a second wall section, at least one of the first wall section and the second wall section at least in part being shaped in the manner of a bellows, and the second wall section, at least in a neutral state of the actuator device, being arranged in a nested manner within the first wall section so as to define a ring shaped chamber section of the actuation chamber, and, in a second step, providing an actuation fluid to the actuation chamber, the actuation fluid having an actuation pressure, the actuation pressure defining an actuation force exerted by the actuator device along a direction of actuation along the actuator axis onto the component.

In some embodiments, a method of manufacturing a wall element of an actuator device includes providing and connecting a first wall section of the wall element and a second wall section of the wall element, at least one of the first wall section and the second wall section at least in part being shaped in the manner of a bellows, the first wall section and the second wall section being connected such that the second wall section is arranged in a nested manner within the first wall section so as to define a ring shaped chamber section of an actuation chamber at least partially confined by the wall element.

In certain embodiments, an actuator device includes an actuation unit, the actuation unit defining an actuator axis and a direction of actuation along the actuator axis and, in a neutral state of the actuator device, having an actuation unit length along the actuator axis. The actuation unit is adapted to receive an actuation energy, the actuation energy defining an actuation force exerted by the actuator device along the direction of actuation. The actuation unit includes a first section, a second section and a linking section linking the first and second section, the linking section, at least in the neutral state, being folded back along the actuator axis such that the actuation unit has an effective length along the actuator axis that corresponds at least to 140% of the actuation unit length.

In some embodiments, an actuator device includes an actuation chamber, the actuation chamber defining an actuator axis and a direction of actuation along the actuator axis and, in a neutral state of the actuator device, having a chamber length along the actuator axis. The actuation chamber is adapted to receive an actuation fluid having an actuation pressure, the actuation pressure defining an actuation force exerted by the actuator device along the direction of actuation. The actuation chamber is at least partially confined by at least one wall element, the at least one wall element including a first wall section and a second wall section. The second wall section, at least in the neutral state, is arranged in a nested manner within the first wall section such that the at least one wall element has an effective length along the actuator axis that is at least 120% of the chamber length.

Further aspects and embodiments of the disclosure will become apparent from the figures, description and claims.

DETAILED DESCRIPTION

In the following, an optical imaging arrangement 101 according to the disclosure will be described with reference to FIGS. 1 to 5.

Figure 1:
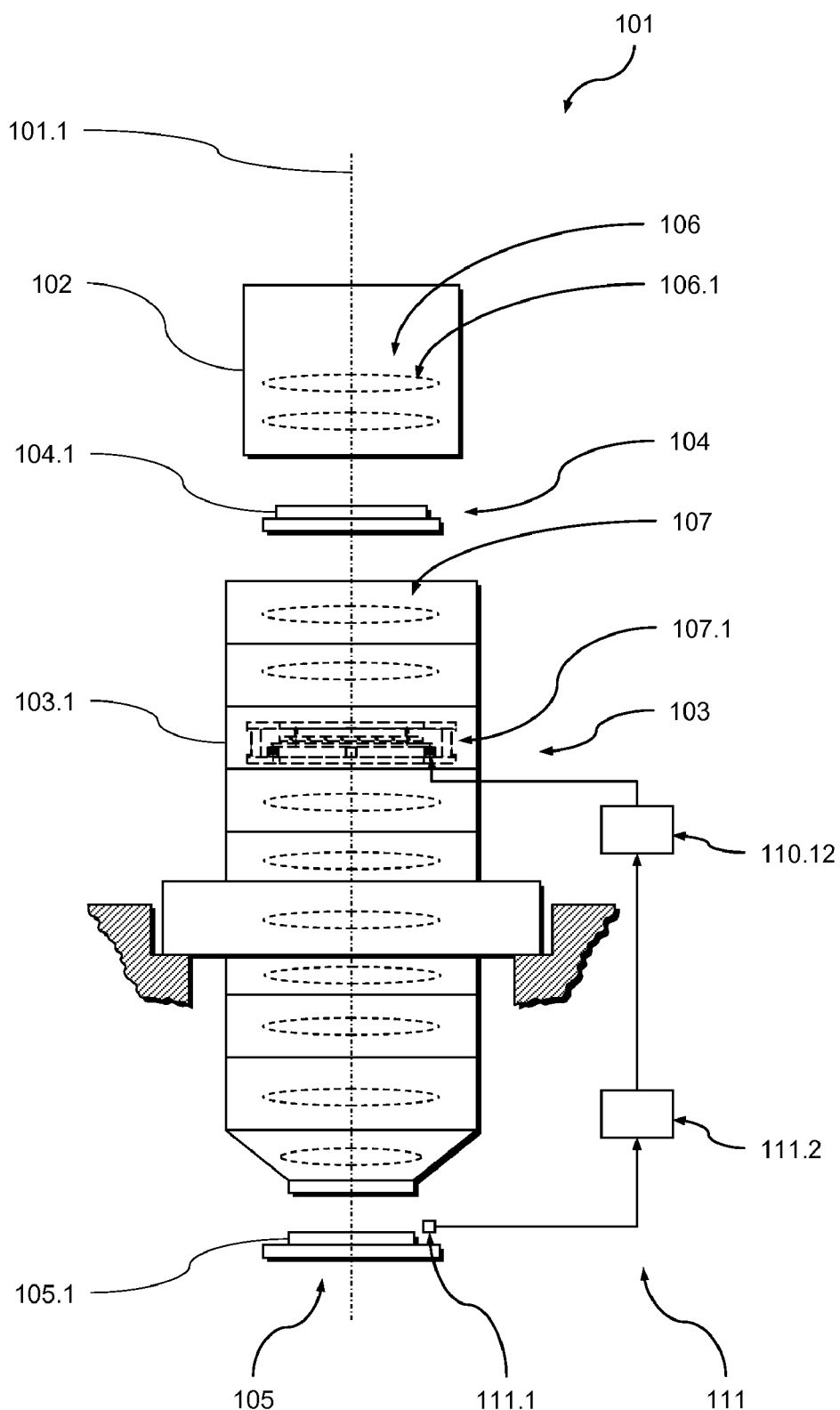
FIG. 1 is a schematic representation of an optical imaging arrangement which includes an optical element unit.

FIG. 1 is a schematic and not-to-scale representation of the optical imaging arrangement in the form of an optical exposure apparatus 101 used in a microlithography process during manufacture of semiconductor devices. The optical exposure apparatus 101 includes a first optical device in the form of an illumination unit 102 and a second optical device in the form of an optical projection unit 103 adapted to transfer, in an exposure process, an image of a pattern formed on a mask 104.1 of a mask unit 104 onto a substrate 105.1 of a substrate unit 105. To this end, the illumination unit 102 illuminates the mask 104.1 with exposure light at a wavelength of 193 nm. The optical projection unit 103 receives the exposure light coming from the mask 104.1 and projects the image of the pattern formed on the mask 104.1 onto the substrate 105.1, e.g. a wafer or the like.

The illumination unit 102 includes a light source (not shown) and an optical element system 106 including a plurality of optical element units such as optical element unit 106.1. The optical projection unit 103 includes a further optical element system 107 including a plurality of optical element units 107.1. The optical element units of the optical element systems 106 and 107 are aligned along an (eventually folded) optical axis 101.1 of the optical exposure apparatus 101 and may include any type of optical element, such as lenses, mirrors, gratings or the like.

The optical element system 107 is held by a stack of optical element units in the form of optical element modules including an optical element module 107.1. As may be seen from FIG. 2, the optical element unit 107.1 includes a first optical element in the form of a lens 108 held by a support structure 109. The support structure 109 includes a ring shaped lens holder 109.1 contacting the lens 108. The lens holder 109.1 in turn is supported by a ring shaped support device 109.2 which in turn is connected to the housing 103.1 of the optical projection unit 103. In particular, the lens holder 109.1 is suspended via four holding elements 109.3 to an upper ring shaped support element 109.4 of the support device 109.2. The holding elements 109.3, in the state shown in FIG. 2, take the gravitational force G acting on the assembly formed by the lens 108 and the lens holder of 109.1.

The holding elements 109.3 are evenly distributed at the circumference of the lens holder 109.1. and define the position of the assembly formed by the lens 108 and the lens holder of 109.1. To this end, the holding elements 109.3 may be simple passive elements. However, it is also possible that the holding elements 109.3 are active control elements actively adjusting the position of the assembly formed by the lens 108 and the lens holder of 109.1 under the control of a suitable control device connected thereto.

Furthermore, four identical fluidic actuator devices in the form of actuators 110 are evenly distributed at the circumference of the lens holder 109.1. However, it will be appreciated that, any other desired and suitable number of actuators may be chosen. The holding elements 109.3 and the actuators 110 are alternately and evenly distributed at the circumference of the lens holder 109.1 such that each holding element 109.3 is rotated by an angle of 45° (about the optical axis 101.1) with respect to an adjacent actuator 110.

Figure 3:
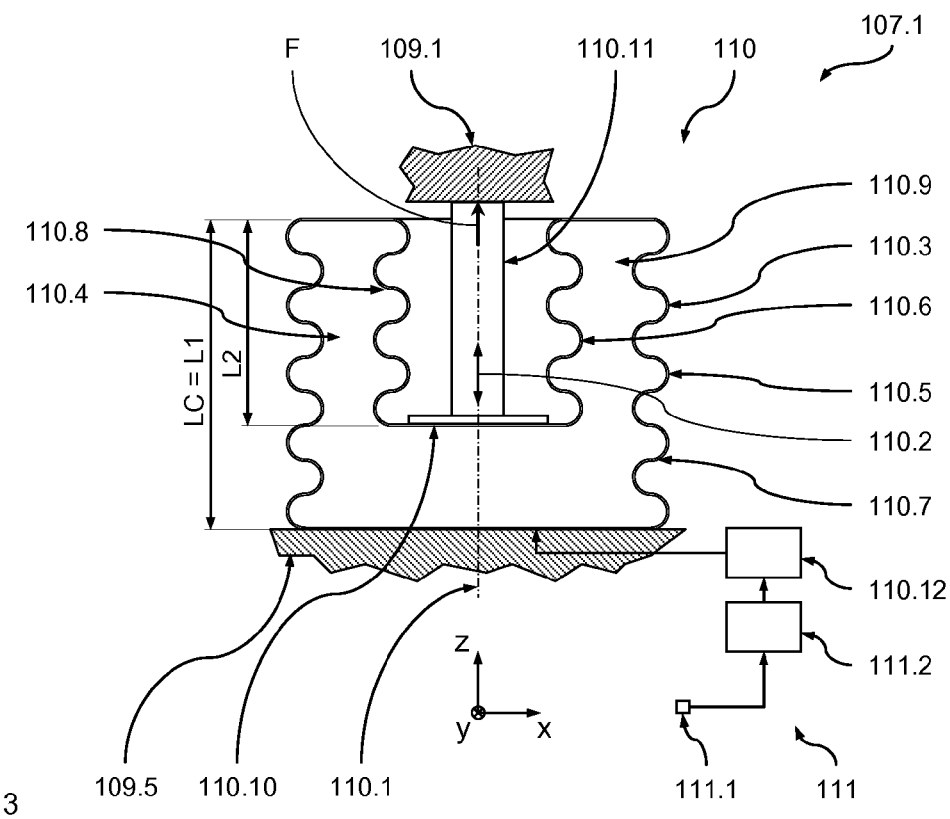
FIG. 3 is a schematic sectional view of the detail III of the optical element unit of FIG. 2 in a neutral state.
Figure 4:
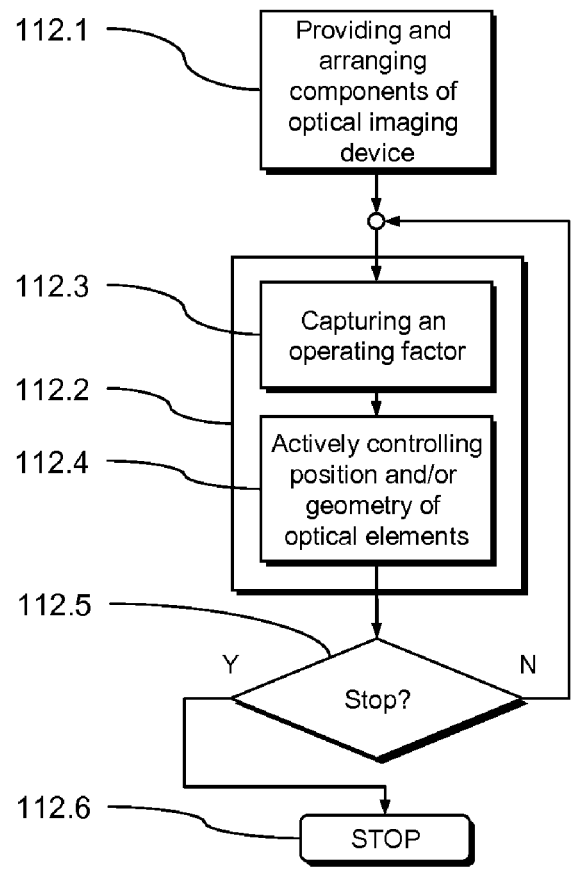
FIG. 4 is a block diagram of a method of exerting a force on a component of the optical element unit of FIG. 2.
Figure 5:
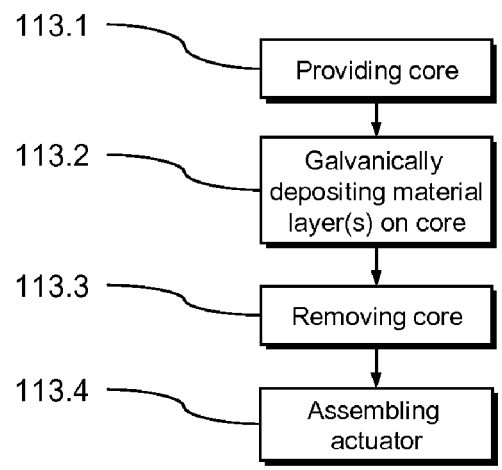
FIG. 5 is a block diagram of a method of manufacturing the actuator device of FIG. 3.

As can be seen best from FIG. 3, the actuator 110, at a first end, is supported on a lower ring shaped support element 109.5 of the support device 109.2. Furthermore, the actuator 110, at a second end, contacts the lower surface of the lens holder 109.1 in order to be able to exert an actuation force F onto the lens holder 109.1 along an actuator axis 110.1 defining a direction of actuation 110.2.

The actuator 110 includes a monolithic thin walled wall element 110.3 confining an actuation chamber 110.4 in a gas tight manner. The wall element 110.3, among others, includes an outer first wall section 110.5 and an inner second wall section 110.6.

The actuation chamber 110.4 may be filled with a pressurized actuation fluid such that a certain actuation pressure prevails within the actuation chamber 110.4. In FIG. 3, the actuator 110 is shown in a neutral state where the actuation pressure $p_c$ within the actuation chamber 110.4 substantially corresponds to the pressure $p_a$ in the atmosphere surrounding the actuator 110 such that the gage pressure $p_g$, i.e. the pressure difference between the surrounding atmosphere and the actuation pressure within the actuation chamber 110.4, is substantially zero, whereby the gage pressure $p_g$ calculates as:

$$p_g = p_c - p_a. \quad (1)$$

The first wall section 110.5 is of generally cylindrical design defining a cylinder axis that is collinear with the actuator axis 110.1. Thus, the first wall section 110.5, in a plane perpendicular to the actuator axis 110.1, has a generally circular cross-section. The first wall section 110.5, along the actuator axis 110.1, has a first length L1 substantially corresponding to the length LC of the actuation chamber of 110.4 along the actuator axis 110.1.

Over its entire length L1, the first wall section 110.5 has a corrugated design, i.e. a plurality of corrugations 110.7, such that, in other words, the first wall section 110.5, over its entire length L1, is shaped in the manner of a bellows. However, it will be appreciated that the corrugated design may also be limited to a certain fraction of the length L1 of the first wall section while the remaining part of the first wall section may be of straight design.

The second wall section 110.6 is also of generally cylindrical design defining a cylinder axis that is collinear with the actuator axis 110.1 and, consequently, collinear with the axis of the first wall section 110.5. Thus, the second wall section 110.6, in a plane perpendicular to the actuator axis 110.1, also has a generally circular cross-section. The second wall section 110.6, along the actuator axis 110.1, in the neutral state shown, has a second length L2 along the actuator axis 110.1 corresponding to more than 50%, namely roughly 66%, of the first length L1 of the first wall section 110.5.

The second wall section 110.6, along the actuator axis 110.1, also has a corrugated design, i.e. a plurality of corrugations 110.8, such that, in other words, the second wall section 110.6 as well is shaped in the manner of a bellows. However, it will be appreciated that the corrugated design may also be limited to a certain fraction of the length L2 of the second wall section while the remaining part of the second wall section may be of straight design.

It will be appreciated that the number and/or the geometry on the corrugations 110.7 and 110.8 may be selected as a function of a desired axial rigidity of the actuator 110 along the actuator axis 110.1 and/or of a desired transverse rigidity of the actuator 110 transverse to the actuator axis 110.1. While in the embodiment shown continuously curved corrugations are a used it will be appreciated that, other types of corrugated designs may be used. In particular, designs having a zigzagging shape (in a sectional plane including the actuator axis) may also be used.

It will be further appreciated that, the first and/or second wall section do not necessarily have to be of generally cylindrical shape. It is also possible that either one of the first and second wall section is of generally prismatic shape, i.e. has a polygonal cross-section in a plane perpendicular to the actuator axis. Furthermore, it will be appreciated that the axis defined by the first wall section and the axis defined by the second wall section do not necessarily have to be collinear. In particular, if (apart from the actuation force F along the actuator axis) a further actuation force or moment in a different direction is desired, such as non-collinear design may be chosen.

As can be seen from FIG. 3, the second wall section 110.6 is folded back into the first wall section 110.5. Thus, the second wall section 110.6 is arranged in a nested manner within the first wall section 110.5 such that a ring shaped chamber section 110.9 of the actuation chamber 110.4 is confined by the first wall section 110.5 and the second wall section 110.6. The ring shaped chamber section 110.9 also defines an axis that is collinear with the actuator axis 110.1.

At its inner (here lower) end located within the first wall section 110.5 the second wall section 110.6 is monolithically connected to a third wall section 110.10 of the wall element 110. The third wall section 110.10 substantially extends in a plane perpendicular to the actuator axis 110.1. The third wall section 110.10 forms a mounting base for a first end of a force transmitting device in the form of a push-rod 110.11. The rod 110.11 extends along the actuator axis 110.1 and, at its second end, is connected to the lens holder in 109.1.

It will be appreciated that, the actuation chamber and may be confined by a plurality of separate wall elements connected in a suitable fluid tight manner. In particular, the separate wall elements may be of different design, different wall thickness distribution, different material etc.

In its neutral state, the actuator 110 is in a retracted state. If the actuation pressure within the actuation chamber 110.4 is raised above the pressure within the atmosphere surrounding the actuator of 110, i.e. if the gage pressure $p_g$ is raised to a positive value, the corrugations 110.7 of the first wall section 110.5 are straightened while the corrugations 110.8 of the second wall section 110.6 are further compressed due to the now existing positive pressure difference between the actuation pressure within the actuation chamber 110.4 and the pressure within the atmosphere surrounding the actuator of 110. Thus, the actuator 110 extends and, via the rod 110.11, exerts a positive force F onto the lens holder 109.1.

Furthermore, if the actuation pressure within the actuation chamber 110.4 is lowered below the pressure within the atmosphere surrounding the actuator of 110, i.e. if the gage pressure $p_g$ is lowered to a negative value, the corrugations 110.7 of the first wall section 110.5 are further compressed while the corrugations 110.8 of the second wall section 110.6 are straightened due to the now existing negative pressure difference between the actuation pressure within the actuation chamber 110.4 and the pressure within the atmosphere surrounding the actuator of 110. Thus, the actuator 110 further retracts and, via the rod 110.11, exerts a negative force F onto the lens holder 109.1.

This actuation force F causes a corresponding (positive or negative) shift of the part of the lens holder 109.1 immediately adjacent to the actuator 110 and, consequently, of the part of the lens 108 immediately adjacent to the actuator 110 along the optical axis 101.1. On the contrary, the holding elements 109.3 may maintain their length along the optical axis 101.1 such that the respective part of the lens holder 109.1 immediately adjacent to the respective holding element 109.3 and, consequently, of the part of the lens 108 immediately adjacent to the respective holding element 109.3 maintains its position along the optical axis 101.1.

Thus, via the respective actuation pressure within the four actuators 110, a certain deformation of the lens 108 (i.e. an alteration within the geometry of the lens 108), may be achieved while the position of the lens 108 (more precisely, the position of e.g. the optical center or another suitable reference point of the lens 108) in space remains unchanged.

A so called two-wave deformation may be introduced into the lens 108 by operating two diagonally opposite actuators 110 at a suitable positive gage pressure and the other two diagonally opposite actuators 110 at a suitable negative gage pressure. Furthermore, a so called four-wave deformation may be introduced into the lens 108 by operating all four actuators 110 at a suitable positive (or negative) gage pressure. It will be appreciated that depending on the number of actuators and holding elements used, any other desired n-wave deformation may be introduced into the lens 108.

It will be further appreciated that the actuation force F provided by the actuator 110 (typically acting in combination with further actuators and acting in a more direct manner on the lens) may also be used for altering the position of the lens 108 in the z-direction as well as the tilting angle of the lens 108 about the x- and y-axis may be adjusted. The maximum displacement of the lens 108 in the z-direction is defined by the range of displacement of the actuator 110, i.e. the achievable maximum extension of the actuator 110 along the actuator axis 110.1.

The folded back or nested design of the wall element 110.3 has the advantage that, at given geometric boundary conditions for the actuator 110 in the neutral state, an increase in the effective length LE of the wall element 110.3 along the actuator axis 110.1 may be achieved with respect to known non-nested actuator designs where the effective length of the wall element confining the actuation chamber typically corresponds to the length of the actuation chamber.

In particular, the effective length LE calculates as the sum of the first length L1 of the first wall section 110.5 and the second length L2 of the second wall section 110.6, i.e. as:

$$LE = L1 + L2. \quad (2)$$

Since, the first length L1 substantially corresponds to the length LC of the actuation chamber 110.4 and the second length L2 corresponds to about 66% of the first length L1, the effective length LE of the wall element 110.3 corresponds to about 166% of the length LC of the actuation chamber 110.4.

This increase in the effective length LE of the wall element 110.3 has the advantage that, on the one hand, it is possible to adjust the axial and/or transverse rigidity of the actuator 110 by simply modifying the second length L2 of the second wall section 110.6. In particular, while the transverse rigidity is predominantly influenced by the additional effective length provided via the nested second wall section 110.6, the axial rigidity is mainly influenced by the additional corrugations available via the nested second wall section 110.6. It will be appreciated that the modification of the second length L2 does not affect the length LC of the actuation chamber 110.4 such that it is feasible within given geometric boundary conditions.

It will be further appreciated that the axial and transverse rigidity of the actuator 110 may also be adjusted by the material and/or the geometry and/or the thickness distribution of the first wall section 110.5 and in the second wall section 110.6. Thus, a broad range of desired axial rigidities and transverse rigidities of the actuator device 110 may be achieved.

Furthermore, an increase in this effective length LE provides an increased range of displacement at a lower variation of the axial and/or transverse rigidity of the actuator 110 over the range of displacement since, thanks to the increased effective length LE, at a given range of displacement, the corrugations of the first wall section 110.5 are less straightened than in the known actuator devices leading to (if any) a lower increase in the axial and/or transverse rigidity of the actuator 110.

Furthermore, at given geometric boundary conditions in the fully retracted state of the actuator 110, it is possible to achieve a higher range of displacement while at the same time keeping the axial and/or transverse rigidity of the actuator 110 low. Thus, thanks to this low axial and/or transverse rigidity lower parasitic loads are introduced into the lens holder 109.1 and, consequently, into the lens 108 leading to a lower amount of imaging errors resulting from such parasitic loads introduced into the optical system.

The axial rigidity and the transverse rigidity of the actuator 110, in the neutral state shown, correspond to less than 75% of the axial rigidity and transverse rigidity, respectively, of a reference actuator in a reference neutral state corresponding to this neutral state. The reference actuator has a reference actuation chamber that is confined by a reference wall element. The reference wall element is made of the same material as the first wall section 110.5, has a reference length along the actuator axis 110.1 that corresponds to the length LC of the actuation chamber 110.4 and has a reference geometry that corresponds to the geometry of the first wall section 110.5. In other words, the reference wall element corresponds to the wall element 110.3 without the nested second and third wall sections 110.3 and 110.10.

Figure 2:
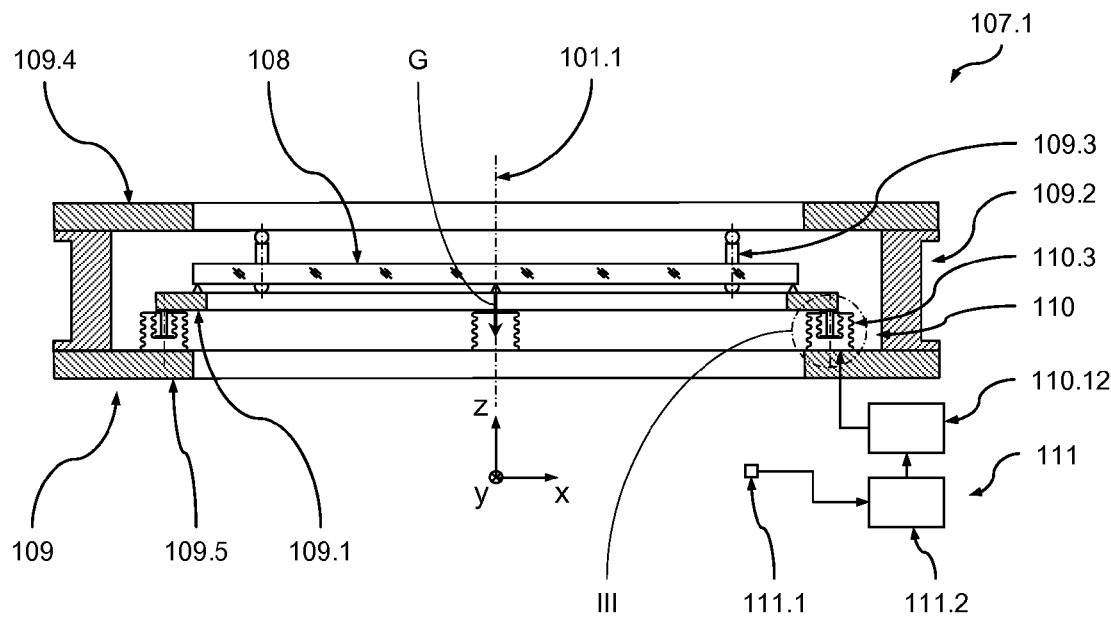
FIG. 2 is a schematic sectional representation of an optical element unit being a part of the optical imaging arrangement of FIG. 1.

It will be appreciated that, the effective length LE may have any other desired value. The effective length LE of the wall element 110.3 can correspond to at least 120% of the length LC of the actuation chamber. In particular, with a single-nested design as shown in FIGS. 2 and 3, where a negative gage pressure is used, the effective length LE may be selected to be between 120% and 150% of the length LC of the actuation chamber in order to provide a sufficient range of displacement. Typically displacements up to 1 mm can be readily achieved.

Typically, with a single-nested design as shown in FIGS. 2 and 3, where negative and positive gage pressures are used (to provide an alternating deformation of the lens 108), the effective length LE may be selected to range from 130% to 170% (e.g., from 145% to 155%) of the length LC of the actuation chamber in order to provide a sufficient range of displacement at advantageously low axial and transverse rigidity. In case only positive gage pressure is to be employed for actuation in one direction only, the effective length may be increased to more than 170%, e.g. even up to 190%.

It will be further appreciated that the effective length LE may even be pushed beyond 200% of the length LC of the actuation chamber by choosing a multiple-nested design where, for example, a further wall section can be arranged in a nested manner within the second wall section in an analogous manner (i.e. the second wall section and the further wall section defining a further ring shaped chamber section of the actuation chamber).

Consequently, the axial rigidity and the transverse rigidity of the actuator, in the neutral state, may even correspond to less than 50% and even down to 25% of the axial rigidity and transverse rigidity, respectively, of a reference actuator as outlined above.

During exposure of the pattern formed on the mask 104.1 onto the substrate 105.1 the deformation (i.e. the geometry) of the lens 108 is actively controlled, among others, via the actuators 110 under the control of a control device 111. The active deformation control of the deformation of the lens 108 is performed as a function of certain operating factors of the exposure apparatus 101. Furthermore, the position (i.e. location and orientation) of the lens 108 may be actively controlled, among others, via the holding elements 109.3 under the control of the control device 111 (in this case also connected to the holding elements 109.3). The active position control of the position of the lens 108 may also be performed as a function of certain operating factors of the exposure apparatus 101.

The actual value of these operating factors is captured by a capturing device 111.1 of the control device 111 and provided to a control unit 111.2 of the control device 111. The control unit 111.2, in response to the actual value of the respective operating factor provided by the capturing device 111.1, generates corresponding control signals. The control unit 111.2 provides these control signals to a pressure source 110.12 of the respective actuator 110.

The pressure source 110.12 is connected to the actuation chamber 110.4 and provides an actuation fluid, here an actuation gas, to the actuation chamber of 110.4 at a pressure that has been adjusted as a function of the control signals provided by the control unit 111.2. It will be appreciated that, instead of a gaseous medium, a liquid medium may also be used as the actuation fluid.

The operating factors used for the active position control of the lens 108 may be any operating factor that may be influenced by the active position control of the lens 108. Typically, this operating factor is an imaging error of the optical system that may be counteracted by the active deformation and/or position control of the lens 108.

With the optical exposure apparatus 101 of FIG. 1 a method of exerting a force on a component of an optical device may be executed as it will be described in the following with reference to FIG. 1 to 4.

In a step 112.1, the components of the optical exposure apparatus 101, in particular and the lens 108 and the support structure 109, as they have been described above are provided and put into a spatial relation to provide the configuration as it has been described in the context of FIGS. 1 to 3.

In a step 112.2, the pattern formed on the mask 104.1 is projected (eventually several steps and/or several times) onto the substrate 105.1. Concurrently with this exposure process, in a step 112.3, the actual value of at least one operating factor of the optical exposure apparatus 101 is captured as it has been described above.

In a step 112.4, the geometry of the lens 108 is actively controlled as it has been described above. Furthermore, as it had been outlined above, in this step 112.4 of the position of the lens 108 may be actively controlled.

In a step 112.5 it is determined if the processes to be stopped. If this is not the case, e.g. if a further substrate 105.1 is to be exposed, the method jumps back to step 112.2. Otherwise the process stops in a step 112.6.

The wall element 110.3 of the actuator 110 of the optical exposure apparatus 101 of FIG. 1 may be manufactured using a method of manufacturing such a wall element as it will be described in the following with reference to FIG. 1 to 5.

In a step 113.1, a core (also referred to as a mandrel) made of aluminum is provided. The core has the geometry of the actuation chamber 110.4 in the neutral state shown in FIG. 3. Further components of the later actuator 110 may already be mounted to the core. For example, the rod 110.11 may be mounted to the core as well as a suitable connector for the actuation fluid line from the pressure source 110.12.

In a step 113.2, one or several layers of nickel (Ni) are galvanically deposited (e.g. electroplated) on the surface of the core to form the wall element 110.3 while at the same time firmly connecting the further components (rod 110.11, fluid line connector etc.) in a gas tight manner to the wall element 110.3. It will be appreciated that other materials or material combinations may be deposited in one or several layers on the core. For example, beryllium copper (BeCu) or titanium (Ti) may also be used as a material for the wall element 110.3.

The wall element 110.3 is given a uniform thickness. However, it will be appreciated that any desired thickness distribution over the wall element may be provided. For example, the first wall section and the nested second wall section may be given a different thickness. Furthermore, the thickness may be altered over the respective wall section etc.

In a step of 113.3, the core is removed by dissolving it such that the thin walled wall element 110.3 with the embedded further components is obtained. Finally, in a step 113.4, the actuator 110 is assembled to provide the configuration as it has been described above.

As it had already been mentioned above, the actuation chamber and may be confined by a plurality of separate wall elements connected in a suitable fluid tight manner. In particular, the separate wall elements may be of different design, different wall thickness distribution, different material etc. Furthermore, in this case, the separate wall elements do not necessarily have to be formed in a galvanic deposition process. For example, one or several of these separate wall elements may in this case also be formed by a suitably deformed stainless steel material.

Figure 6:
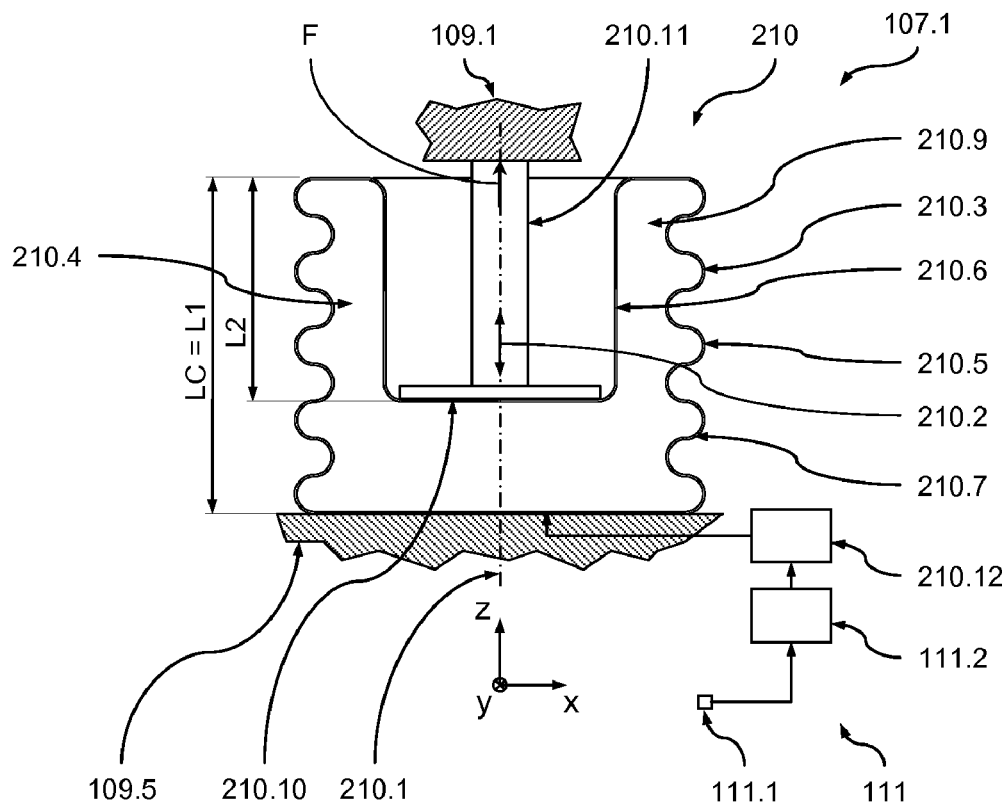
FIG. 6 is a schematic sectional view of an actuator device in a neutral state.

A actuator 210 will be described with reference to FIG. 6. The actuator 210 in its basic design and functionality largely corresponds to the actuator 110 and may replace the actuator 110 in the optical imaging device 101 of FIG. 1. Thus, it is here mainly referred to the explanations given above and only the differences with respect to the actuator 110 will be explained in further detail. In particular, similar parts are given the same reference numeral raised by the amount 100 and (unless explicitly described in the following) in respect to these parts reference is made to the explanations given above.

The second wall section 210.6 nested within the first wall section 210.5 is a substantially straight cylindrical wall section without any corrugations. As a consequence, the increase in the effective length LE achieved by this nested arrangement mainly has an influence on the transverse rigidity of the actuator 210 while the axial rigidity along the actuator axis 210.1 substantially remains unchanged with respect to a corresponding reference actuator. Consequently, it is possible to separately influence the transverse rigidity and the axial rigidity of the actuator.

It will be appreciated that it may also be provided that the first wall section is a substantially straight wall section (without corrugations) while the second wall section is a corrugated wall section as it has been described above.

Figure 7:
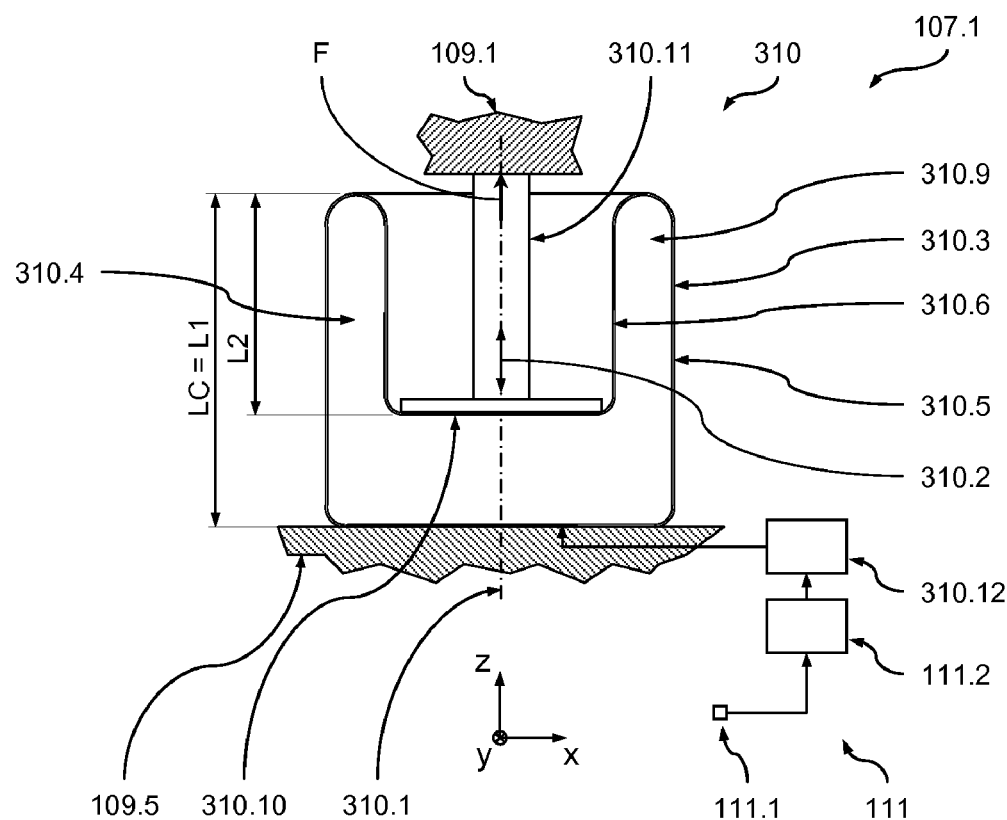
FIG. 7 is a schematic sectional view of an actuator device in a neutral state.

A fluidic actuator 310 will be described with reference to FIG. 7. The actuator 310 in its basic design and functionality largely corresponds to the actuator 110 and may replace the actuator 110 in the optical imaging device 101 of FIG. 1. Thus, it is here mainly referred to the explanations given above and only the differences with respect to the actuator 110 will be explained in further detail. In particular, similar parts are given the same reference numeral raised by the amount 200 and (unless explicitly described in the following) in respect to these parts reference is made to the explanations given above.

Both the second wall section 310.6 nested within the first wall section 310.5 and the first wall section 310.5 are substantially straight cylindrical wall sections without any corrugations. The extension of the actuator 310 is achieved by a rolling unfolding process in the curved transition section 310.13 between the first wall section 310.5 and the second wall section 310.6.

As a consequence, a comparatively high axial rigidity is achieved while the increase in the effective length LE achieved by this nested arrangement mainly has an influence on the transverse rigidity of the actuator 310. Consequently, it is possible to achieve a low transverse rigidity while at the same time providing a high axial rigidity of the actuator.

An actuator 410 will be described with reference to FIG. 8. The actuator 410 in its basic design and functionality corresponds to the actuator 110 and may replace the respective actuator 110 in the optical imaging device 101 of FIG. 1.

Thus, similar parts are given the same reference numeral raised by the amount 300 and (unless explicitly described in the following) in respect to these parts reference is made to the explanations given above.

Figure 8:
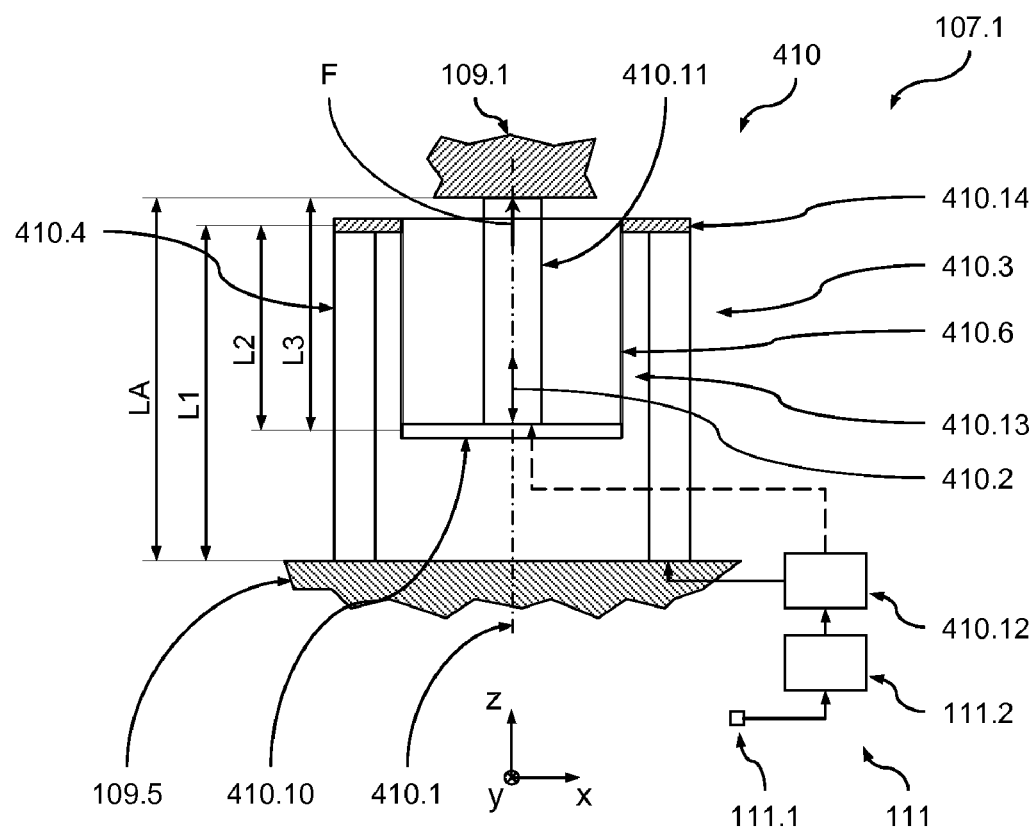
FIG. 8 is a schematic sectional view of an actuator device in a neutral state.

As can be seen from FIG. 8 (showing the actuator 410 in a highly schematic manner), the actuator 410, at a first end, is supported on the lower ring shaped support element 109.5 of the support device 109.2. Furthermore, the actuator 410, at a second end, contacts the lower surface of the lens holder 109.1 in order to be able to exert an actuation force F onto the lens holder 109.1 along an actuator axis 410.1 defining a direction of actuation 410.2.

The actuator 410 includes an actuation unit 410.3 with a first section 410.4, a second section 410.11 and a linking section 410.13 arranged kinematically in series between the support element 109.5 and the lens holder 109.1. The linking section 410.13 is folded back along the actuator axis 410.1 such that the first section 410.4 and the second section 410.11 overlap along the actuator axis 410.1. More precisely, the linking section 410.13 links the first section 410.4 and the second section 410.11 in such a manner that the second section 410.11 is arranged in a nested manner within the first section 410.4. By this means the effective length LE of the actuation unit 410.3 along the actuator axis 410.1 is increased with respect to the length LA of the actuation unit 410.3 along the actuator axis 410.1 as will be explained in further detail below.

Either one of the first section 410.4 and the second section 410.11 may be an actuation section including an actuation element (not shown in further detail) providing an actuation force F along the actuator axis 410.1 when an actuation energy is provided to the respective actuation element by an energy source 410.12. Only the first section 410.4 is connected to the energy source 410.12 and provides a first actuation force F1 along the actuator axis 410.1, while the second section 410.11 is a simple passive component, for example, a simple push rod. However, it will be appreciated that, in addition or as an alternative, the second section 410.11 may also be connected to the energy source 410.12 (as it is indicated in FIG. 8 by the dashed contour) or to a further energy source in order to provide a second actuation force F2 along the actuator axis 410.1. In this case, the first section may be a simple passive component.

The respective actuation element may be any suitable actuation element providing an actuation force. For example, the actuation element may be a fluidic actuator provided with an actuation energy in the form of a correspondingly pressurized actuation fluid. Furthermore, the respective actuation element may be any type of electric or electromechanical actuation element, such as a piezoelectric actuator, a so-called Lorentz actuator etc. Such an electric actuation element is provided with actuation energy in the form of electric energy. Of course, any desired combination of such actuation elements may be used within either one of the first section 410.4 and the second section 410.11 as well as within the actuation unit 410.3.

In FIG. 8, the actuator 410 is shown in a neutral state. If a fluidic actuation element is used, this neutral state is the state where the actuation pressure $p_c$ within the fluidic actuation element substantially corresponds to the pressure $p_a$ in the atmosphere surrounding the actuation element 410 such that the gage pressure $p_g$ (i.e. the pressure difference between the surrounding atmosphere and the actuation pressure within the actuation element) is substantially zero, whereby the gage pressure $p_g$ calculates according to equation (1) as:

$$p_g = p_c - p_a.$$

If an electric actuation element is used, the neutral state may be the state where no electric energy is provided to the actuation element.

The first section 410.4 is of generally cylindrical design defining a cylinder axis that is collinear with the actuator axis 410.1. Thus, the first section 410.4, in a plane perpendicular to the actuator axis 410.1, has a generally circular cross-section. The first section 410.4, along the actuator axis 410.1, has a first length L1.

The linking section 410.13 is also of generally cylindrical design defining a cylinder axis that is collinear with the actuator axis 410.1 and, consequently, collinear with the axis of the first section 410.4. Thus, the linking second section 410.13, in a plane perpendicular to the actuator axis 410.1, also has a generally circular cross-section.

The linking section 410.13 includes a thin walled wall element 410.6 of generally cylindrical shape. The wall element 410.6, at a first end, is connected to a flange element 410.14 of the linking section 410.13, the flange element 410.14 being connected to the first section 410.4. At a second end, the wall element 410.6 is connected to a circular base element 410.10 which in turn is connected to the second section 410.11.

The linking section 410.13, along the actuator axis 410.1, in the neutral state shown, has a second length L2 along the actuator axis 410.1 corresponding to more than 50%, namely roughly 66%, of the first length L1 of the first wall section 410.5.

The first section 410.4, in the neutral state, has a certain first axial rigidity along the actuator axis 410.1 and a certain first transverse rigidity transverse to the actuator axis 410.1. Furthermore, the second section 410.11, in the neutral state, has a certain second axial rigidity along the actuator axis 410.1 and a certain second transverse rigidity transverse to the actuator axis 410.1. The first and second axial rigidity may have any desired relation. The same applies to the first and second axial rigidity.

The wall element 410.6 of the linking section 410.13, along the actuator axis 410.1, has a straight design. Thus, the third axial rigidity of the linking section 410.13 along the actuator axis 410.1 and the third transverse rigidity transverse to the actuator axis 410.1 is mainly defined by the material and the cross-section of the wall and into 410.6 (in a plane transverse to the actuator axis 410.1). Since the wall element 410.6 is thin walled, the third axial rigidity is considerably smaller than the first and second axial rigidity. The same applies to the third transverse rigidity which is considerably smaller than the first and second transverse rigidity.

It will be appreciated that, both, the third axial rigidity and the third transverse rigidity may be easily adjusted to a desired value by simply adjusting the material properties and/or the geometry of the wall element 410.6, in particular, by adjusting the length, the diameter and/or the wall thickness of the wall element 410.6. Thus, configurations may be easily achieved wherein the third axial rigidity is less than 50%, even less than 25%, of one of the first and second axial rigidity (e.g., of the smaller one of the first and second axial rigidity). The same applies to the third transverse rigidity where configurations may be easily achieved where the third transverse rigidity is less than 50%, even less than 25%, of one of the first and second transverse rigidity (e.g., of the smaller one of the first and second transverse rigidity).

It will be appreciated that, to further reduce the third axial rigidity and/or the third transverse rigidity, the wall element of the linking section may have a corrugated design, i.e. a plurality of corrugations, such that, in other words, the wall element 410.6 is shaped in the manner of a bellows as it has been described above. However, it will be appreciated that the corrugated design may also be limited to a certain fraction of the length L2 of the linking section while the remaining part of the linking section may be of straight design.

It will be appreciated that the number and/or the geometry on the corrugations may be selected as a function of a desired axial rigidity of the actuator 410 along the actuator axis 410.1 and/or of a desired transverse rigidity of the actuator 410 transverse to the actuator axis 410.1. It will be appreciated that continuously curved corrugations may be used as well as other types of corrugated designs. In particular, designs having a zigzagging shape (in a sectional plane including the actuator axis) may also be used.

It will be further appreciated that the first and/or second section do not necessarily have to be of generally cylindrical shape. It is also possible that either one of the first and second section is of generally prismatic shape, i.e. has a polygonal cross-section in a plane perpendicular to the actuator axis. Furthermore, it will be appreciated that the axis defined by the first wall section and the axis defined by the second wall section do not necessarily have to be collinear. In particular, if (apart from the actuation force F along the actuator axis) a further actuation force or moment in a different direction is desired, such as non-collinear design may be chosen.

As can be seen from FIG. 8, the wall element 410.6 is folded back into the first section 410.4. Thus, the wall element 410.6 is arranged in a nested manner within the first wall section 410.5. At its inner (here lower) end located within the first section 410.6 the wall element 410.6 is connected to the base element 410.10 of the wall element 410. The base element 410.10 substantially extends in a plane perpendicular to the actuator axis 410.1. The base element 410.10 forms a mounting base for a first end of the second section 410.11. The second section 410.11 extends along the actuator axis 410.1 and, at its second end, is connected to the lens holder in 109.1.

In its neutral state, the actuator 410 is in a retracted state. If actuation energy of a first polarity is provided to the actuation element of the first section 410.4 (e.g. if the gage pressure $p_g$ within a fluidic actuation element is raised to a positive value or if a positive electric tension is applied to an electric actuation element), the actuation element of the first section 410.4 extends and, via the linking section 410.13 and the second section 410.11, exerts a positive force F onto the lens holder 109.1. Furthermore, if actuation energy of a second polarity is provided to the actuation element of the first section 410.4 (e.g. if the gage pressure $p_g$ within a fluidic actuation element is lowered to a negative value or if a negative electric tension is applied to an electric actuation element), the actuation element of the first section 410.4 further retracts and, via the linking section 410.13 and the second section 410.11, exerts a negative force F onto the lens holder 109.1.

This actuation force F causes a corresponding (positive or negative) shift of the part of the lens holder 109.1 immediately adjacent to the actuator 410 and, consequently, of the part of the lens 108 immediately adjacent to the actuator 410 along the optical axis 101.1. On the contrary, the holding elements 109.3 may maintain their length along the optical axis 101.1 such that the respective part of the lens holder 109.1 immediately adjacent to the respective holding element 109.3 and, consequently, of the part of the lens 108 immediately adjacent to the respective holding element 109.3 maintains its position along the optical axis 101.1.

Thus, via the respective actuation energy provided to the four actuators 410, a certain deformation of the lens 108 (i.e. an alteration within the geometry of the lens 108), may be achieved while the position of the lens 108 (more precisely, the position of e.g. the optical center or another suitable reference point of the lens 108) in space remains unchanged.

A so called two-wave deformation may be introduced into the lens 108 by providing two diagonally opposite actuators 410 with a suitable actuation energy of the first polarity and the other two diagonally opposite actuators 410 with a suitable actuation energy of a second polarity. Furthermore, a so called four-wave deformation may be introduced into the lens 108 by providing to all four actuators 410 and actuation energy at a suitable first (or second) polarity. It will be appreciated that, depending on the number of actuators and holding elements used, any other desired n-wave deformation may be introduced into the lens 108.

It will be further appreciated that the actuation force F provided by the actuator 410 (typically acting in combination with further actuators and acting in a more direct manner on the lens) may also be used for altering the position of the lens 108 in the z-direction as well as the tilting angle of the lens 108 about the x- and y-axis may be adjusted. The maximum displacement of the lens 108 in the z-direction is defined by the range of displacement of the actuator 410, i.e. the achievable maximum extension of the actuator 410 along the actuator axis 410.1.

The folded back or nested design of the actuation unit 410.3 has the advantage that, at given geometric boundary conditions for the actuator 410 in the neutral state, an increase in the effective length LE of the actuation unit 410.3 along the actuator axis 410.1 may be achieved with respect to known non-nested actuator designs where the effective length of the actuation unit typically corresponds to the length of the actuator.

In particular, the effective length LE calculates as the sum of the first length L1 of the first section 410.4, the second length L2 of the linking section 410.13 and the third length L3 of the second section 410.11, i.e. as:

$$LE=L1+L2+L3. \qquad (3)$$

Since, the first length L1 corresponds to about 95% of the length LA of the actuation chamber 410.4 and the second length L2 corresponds to about 66% of the first length L1 while the third length L3 corresponds to about 70% of the first length L1, the effective length LE of the wall element 410.3 corresponds to about 224% of the length LA of the actuator 410.

This increase in the effective length LE of the actuation unit 410.3 has the advantage that, on the one hand, it is possible to adjust the axial and/or transverse rigidity of the actuator 410 by simply modifying the second length L2 of the linking section 410.13 and the third length L3 of the second section 410.11. It will be appreciated that the modification of the second length L2 and the third length L3 does not affect the length LA of the actuator 410 such that it is feasible within given geometric boundary conditions.

It will be further appreciated that the axial and transverse rigidity of the actuator 410 may also be adjusted by the material and/or the geometry and/or the thickness distribution of the wall element 410.6. Thus, a broad range of desired axial rigidities and transverse rigidities of the actuator device 410 may be achieved.

Furthermore, an increase in the effective length LE of the actuation unit 410.3, at a given actuator length LA, provides an increased range of displacement if the first section 410.4 and the second section 410.11 are active sections, i.e. include at least one actuation element, while at the same time keeping the axial and/or transverse rigidity of the actuator 410 low. Thus, thanks to this low axial and/or transverse rigidity lower parasitic loads are introduced into the lens holder 109.1 and, consequently, into the lens 108 leading to a lower amount of imaging errors resulting from such parasitic loads introduced into the optical system.

The axial rigidity and the transverse rigidity of the actuator 410, in the neutral state shown, correspond to less than 75% of the axial rigidity and transverse rigidity, respectively, of a reference actuator in a reference neutral state corresponding to this neutral state. The reference actuator includes the first section 410.4 and the second section 410.11 connected by a reference linking section that is substantially rigid, i.e. has a fourth axial rigidity that is higher than the first and second axial rigidity and a fourth transverse rigidity that is higher than the first and second transverse rigidity.

It will be appreciated that the effective length LE may have any other desired value. The effective length LE of the actuation unit 410.3 can correspond to at least 140% of the length LA of the actuator. In particular, with a single-nested design as shown in FIG. 8, where negative force is generated by further retracting the actuator, the effective length LE may be selected to be between 150% and 200% of the length LA of the actuator in order to provide a sufficient range of displacement. Typically displacements up to 1 mm can be readily achieved.

Typically, with a single-nested design as shown in FIG. 8, where negative and positive forces F are provided (to provide an alternating deformation of the lens 108), the effective length LE may be selected to range from 160% to 240% (e.g., from 190% to 224%) of the length LA of the actuator in order to provide a sufficient range of displacement at advantageously low axial and transverse rigidity. In case only positive forces are to be generated for actuation in one direction only, the effective length may be increased to more than 240%, e.g. even up to 280% of the length LA of the actuator.

It will be further appreciated that the effective length LE may even be pushed beyond 300% of the length LA of the actuator by choosing a multiple-nested design where, for example, a further linking section is arranged in a nested manner within the second section in an analogous manner (i.e. the second wall section and the further linking section defining a further ring shaped section of the actuation unit).

Consequently, the axial rigidity and the transverse rigidity of the actuator, in the neutral state, may even correspond to less than 50% and even down to 25% of the axial rigidity and transverse rigidity, respectively, of a reference actuator as outlined above.

Figure 9:
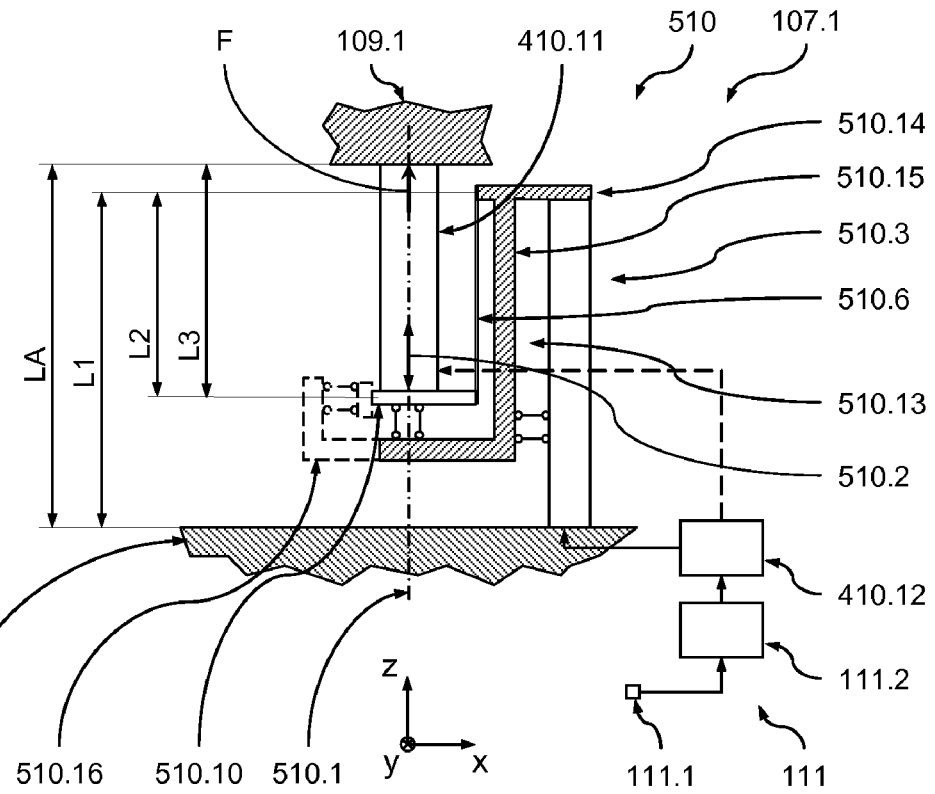
FIG. 9 is a schematic sectional view of an actuator device in a neutral state.

A fluidic actuator 510 will be described with reference to FIG. 9. The actuator 510 in its basic design and functionality largely corresponds to the actuator 410 and may replace the respective actuator 110 in the optical imaging device 101 of FIG. 1. Thus, it is here mainly referred to the explanations given above and only the differences with respect to the actuator 410 will be explained in further detail. In particular, similar parts are given the same reference numeral raised by the amount 100 and (unless explicitly described in the following) in respect to these parts reference is made to the explanations given above.

The second section 410.11 is not nested within the first section 510.4. Rather the linking section 510.13 is only folded back along the actuator axis 510.1 in such a manner that the first section 510.4 and the second section 510.11 simply overlap along the actuator axis 510.1. To this end, the linking section 510.13 includes a guiding section 510.15 arranged kinematically parallel to the thin walled wall element 510.6 and connected to the flange 510.14 and to the base element 510.10 in order to provide a suitable guide function along and transverse to the actuator axis 510.1.

As a consequence, a comparatively high axial rigidity is achieved while the increase in the effective length LE achieved by this folded back arrangement mainly has an influence on the transverse rigidity of the actuator 510. Consequently, it is possible to achieve a low transverse rigidity while at the same time providing a high axial rigidity of the actuator. However, it will be appreciated that it is also possible to achieve a low axial rigidity while at the same time providing a high transverse rigidity simply by replacing the guide mechanism between the guiding section 510.15 and the base element 510.10 by a guide mechanism as it is indicated by the dashed contour 510.16.

In the foregoing, the disclosure has been described above where optical element units including an optical element and a holder holding the optical element have been used. However, it will be appreciated that the disclosure may also be applied to embodiments where the actuator is directly connected to the optical element.

Furthermore, the disclosure has predominantly been described in the context of embodiments where the fluidic actuator is used for altering the position (i.e. location and/or orientation in space) of an optical element. However, as already indicated above, it will be appreciated that the actuation force provided by the actuator according to the disclosure may also be used for altering the geometry of such an optical element or any other component of an optical device. Furthermore, the actuation force provided by the actuator according to the disclosure may be used for any other task in such an optical device.

In the foregoing, the disclosure has been described solely in the context of microlithography systems working with exposure light at a wavelength of 193 nm. However, it will be appreciated that the disclosure may also be used in the context of any other optical device working at any other wavelength, in particular, any other optical device using deformation sensitive components. In particular, the disclosure may also be used in the context of so called EUV systems working at a wavelength below 20 nm, typically at about 13 nm.

Finally, it will be appreciated that the disclosure may be used in the context of any type of optical element at any location within an optical device, in particular, in the context of refractive, reflective and diffractive optical elements or any combination thereof.

U.S. Pat. No. 5,822,133 is incorporated herein by reference.

Other embodiments are in the claims.

What is claimed is:

1. An optical element unit, comprising:
   an optical element; and
   a support structure supporting the optical element, the support structure comprising:
   at least one actuator device connected to the optical element and configured to exert an actuation force onto the optical element along a direction of actuation, the at least one actuator device comprising:
      an actuation unit defining an actuator axis and a direction of actuation along the actuator axis, the actuation unit being adapted to receive an actuation energy defining an actuation force exerted by the actuator device along the direction of actuation, the actuation unit comprising:
         a first section which, in a neutral state of the actuation unit, has a first axial rigidity along the direction of actuation and a first transverse rigidity transverse to the direction of actuation;
         a second section which, in the neutral state, has a second axial rigidity along the direction of actuation and a second transverse rigidity transverse to the direction of actuation; and a linking section that links the first and second sections, the linking section, in the neutral state, having a third axial rigidity along the direction of actuation and a third transverse rigidity transverse to the direction of actuation, wherein at least one of the following conditions is satisfied:

the third axial rigidity being smaller than at least one of the first axial rigidity and the second axial rigidity; and the third transverse rigidity being smaller than at least one of the first transverse rigidity and the second transverse rigidity.

2. The optical element unit according to claim 1, wherein the first section, the linking section and the second section are arranged kinematically in series.

3. The optical element unit according to claim 1, wherein at least one of the following conditions is satisfied:

the third axial rigidity is less than at least one of 50% and 75% of the smaller one of the first and second axial rigidity; and the third transverse rigidity is less than at least one of 50% and 75% of the smaller one of the first and second transverse rigidity.

4. The optical element unit according to claim 1, wherein at least one of the first and second sections provides the actuation force exerted by the along the direction of actuation when the actuation energy is supplied to the actuation unit.

5. The optical element unit according to claim 1, wherein the second section, at least in the neutral state of the actuator device, is arranged in a nested manner within the first section.

6. The optical element unit according to claim 5, wherein, in the neutral state:

the first section has a first length along the direction of actuation;

the second section has a second length along the direction of actuation; and the first length is greater than the second length.

7. The optical element unit according to claim 6, wherein, in the neutral state, the second length is at least 30% of the first length.

8. The optical element unit according to claim 5, wherein, on one end of the actuation unit, the second the second, along the direction of actuation, reaches beyond the first section.

9. The optical element unit according to claim 1, wherein at least one of the following conditions is satisfied:

the first section is a ring shaped section defining a first section axis that is substantially parallel to the direction of actuation; and the second section defines a second section axis that is substantially parallel to the direction of actuation.

10. The optical element unit according to claim 9, wherein the first section axis is arranged substantially collinear with the second section axis.

11. The optical element unit according to claim 1, wherein at least one of the first and second sections, in a plane perpendicular to the direction of actuation, has a cross-section selected from the group consisting of substantially circular cross-sections and polygonal cross-sections.

12. The optical element unit according to claim 1, wherein the linking section is monolithically connected to at least one of the first and second sections.

13. The optical element unit according to claim 1, further comprising an energy source connected to the actuation unit, the energy source being configured to provide the actuation energy to the actuation unit.

14. The optical element unit according to claim 13, further comprising a control device connected to the energy source and being configured to provide control signals to the energy source, the energy source being configured to adjust the actuation energy provided to sound actuation unit as a function of the control signals.

15. The optical element unit according to claim 1, wherein:

the actuator device, in a neutral state, has an axial rigidity along the direction of actuation and a transverse rigidity transverse to the direction of actuation;

at least one of the following conditions is satisfied: the axial rigidity is smaller than a reference axial rigidity; and the transverse rigidity is smaller than a reference transverse rigidity;

the reference axial rigidity and the reference transverse rigidity are defined by a reference actuator device in a reference neutral state corresponding to the neutral state;

the reference actuator device comprises the first section, a reference linking section and the second section being arranged kinematically in series; and the reference linking section links the first and second sections at a rigidity corresponding to one of the rigidity of the first section and the rigidity of the second section.

16. The optical element unit according to claim 15, wherein:

the reference linking section, in the reference neutral state, has a fourth axial rigidity along the direction of actuation and a fourth transverse rigidity transverse to the direction of actuation; and at least one of at least one of the following conditions is satisfied:

the fourth axial rigidity corresponding to one of the first axial rigidity and the second axial rigidity; and the fourth transverse rigidity corresponding to one of the first transverse rigidity and the second transverse rigidity.

17. The optical element unit according to claim 1, further comprising an energy source and a control device, wherein the optical element forms part of an optical element group of an optical imaging device, the optical element group being configured to participate in transferring an image of a pattern formed on a mask onto a substrate, the control device being configured to capture an actual value of an operating factor of the optical imaging device, the control device being configured to generate control signals as a function of the actual value of the operating factor and providing the control signals to the energy source, the energy source being connected to the actuation unit and being configured to provide the actuation energy to the actuation unit as a function of the control signals of the control device, the actuator device being configured to exert the actuation force onto the optical element such that at least one of a geometry and a position of the optical element is altered thereby influencing the operating factor.

18. The optical element unit according to claim 17, wherein the optical element forms part of one of an illumination device configured to illuminate the pattern on the mask and an objective device transferring the image of the pattern onto the substrate.

19. An optical element unit, comprising:

an optical element; and a support structure supporting the optical element, the support structure comprising:

at least one actuator device connected to the optical element and configured to exert an actuation force onto the optical element along a direction of actuation, the at least one actuator device comprising:

an actuation chamber defining an actuator axis and the direction of actuation along the actuator axis, the actuation chamber configured to receive an actuation fluid having an actuation pressure, the actuation pressure defining an actuation force exerted by the actuator device along the direction of actuation, the actuation chamber being at least partially confined by at least one wall element, the at least one wall element including a first wall section and a second wall section, at least one of the first wall section and the second wall section at least in part being shaped in the manner of a bellows, the second wall section, at least in a neutral state of the actuator device, being arranged in a nested manner within the first wall section so as to define a ring shaped chamber section of the actuation chamber.

20. The optical element unit according to claim 19, wherein the ring shaped chamber section defines an axis, the chamber section axis of the ring shaped chamber section being substantially parallel to the direction of actuation.

21. The optical element unit according to claim 19, wherein the first wall section is arranged substantially concentric to the second wall section.

22. The optical element unit according to claim 19, wherein, in the neutral state:
the first wall section has a first length along the direction of actuation;
the second wall section has a second length along the direction of actuation; and
the first length being greater than the second length.

23. The optical element unit according to claim 22, wherein, in the neutral state, the second length is at least 30% of the first length.

24. The optical element unit according to claim 19, wherein:
the first wall section comprises at least a first material and, along the direction of actuation, has a first length, a first geometry and a first thickness distribution, and
the second wall section comprises at least a second material and, along the direction of actuation, has a second length, a second geometry and a first thickness distribution; and
at least one of the first material, the second material, the first length, the second length, the first geometry, the second geometry, the first thickness distribution and the second thickness distribution being selected as a function of at least one of a given axial rigidity of the actuator device along the direction of actuation and a given transverse rigidity of the actuator device transverse to the direction of actuation.

25. The optical element unit according to claim 24, wherein:
at least one of the first wall section and the second wall section at least in part has a geometry generally corrugated along the direction of actuation;
the generally corrugated geometry comprise a number of corrugations; and
the number of corrugations are selected as a function of at least one of the given axial rigidity and the given transverse rigidity.

26. The optical element unit according to claim 19, wherein at least one of the first wall section and the second wall section, in a plane perpendicular to the direction of actuation, has one of a substantially circular cross-section and a polygonal cross-section.

27. The optical element unit according to claim 19, further comprising at least one actuation force transmitting device is provided,
wherein:
the second wall section, along the direction of actuation, has an inner end located within the first wall section;
the at least one actuation force transmitting device extends along the direction of actuation and having a first end and a second end; and
the first end of the actuation force transmitting device is connected to the inner end of the second wall section.

28. The optical element unit according to claim 27, wherein the second end of the actuation force transmitting device, along the direction of actuation, reaches beyond the first wall section.

29. The optical element unit according to claim 19, wherein:
the at least one wall element comprises a third wall section and
the second wall section, along the direction of actuation, has an inner end located within the first wall section; and
the third wall section being connected to the second wall section at the inner end of the second wall section.

30. The optical element unit according to claim 19, wherein the first wall section is monolithically connected to the second wall section.

31. The optical element unit according to claim 19, wherein at least one wall section selected from the group consisting of the first wall section and the second wall section comprises at least one layer of material formed in a galvanic deposition process.

32. The optical element unit according to claim 19, wherein at least one at least one wall section selected from the group consisting of the first wall section and the second wall section comprises at least one layer of a material comprising one of nickel, beryllium copper and titanium.

33. The optical element unit according to claim 19, further comprising a pressure source connected to the actuation chamber, the pressure source being configured to pressurize the actuation fluid and providing the actuation fluid to the actuation chamber.

34. The optical element unit according to claim 33, further comprising a control device connected to the pressure source and being configured to provide control signals to the pressure source, the pressure source being configured to adjust the actuation pressure of the actuation fluid as a function of the control signals.

35. The optical element unit according to claim 19, wherein, in the neutral state:
the actuation chamber has a chamber length along the actuator axis;
the actuator device has an axial rigidity along the direction of actuation and a transverse rigidity transverse to the direction of actuation;
at least one of the following conditions is satisfied: the axial rigidity is smaller than a reference axial rigidity; and the transverse rigidity is smaller than a reference transverse rigidity;
the reference axial rigidity and the reference transverse rigidity are defined by a reference actuator device in a reference neutral state corresponding to the neutral state;
the reference actuator device has a reference actuation chamber being confined by a reference wall element;
the reference wall element is made of the same material as the first wall section;
the reference wall element has a reference length along the actuator axis corresponding to the actuator length; and the reference wall element has a reference geometry corresponding to the geometry of the first wall section.

36. The optical element unit according to claim 35, wherein at least one of the following conditions is satisfied:
the axial rigidity is less than 75% of the reference axial rigidity; and
the transverse rigidity is less than 75% of the reference transverse rigidity.

37. The optical element unit according to claim 19, further comprising a pressure source and a control device,
wherein the optical element forms part of an optical element group of an optical imaging device, the optical element group is configured to participate in transferring an image of a pattern formed on a mask onto a substrate, the control device is configured to capture an actual value of an operating factor of the optical imaging device, the control device is configured to generate control signals as a function of the actual value of the operating factor and providing the control signals to the pressure source, the pressure source is connected to the actuation chamber and is configured to pressurize and provide the actuation fluid to the actuation chamber as a function of control signals of the control device, the actuator device is configured to exert the actuation force onto the optical element such that at least one of the geometry and the position of the optical element is altered thereby influencing the operating factor.

38. The optical element unit according to claim 37, wherein the optical element forms part of one of an illumination device configured to illuminate the pattern on the mask and an objective device transferring the image of the pattern onto the substrate.

* * * * *

UNITED STATES PATENT AND TRADEMARK OFFICE
CERTIFICATE OF CORRECTION

PATENT NO. : 7,589,921 B2  Page 1 of 1
APPLICATION NO. : 11/844232
DATED : September 15, 2009
INVENTOR(S) : Yim-Bun Patrick Kwan and Stefan Xalter It is certified that error appears in the above-identified patent and that said Letters Patent is hereby corrected as shown below:

Column 8, Line 33, delete "109.1." insert --109.1--.

Column 21, Line 28, Claim 4, before "along" insert --actuator device--.

Column 21, Line 44, Claim 8, after "unit" delete "the second".

Column 22, Line 30, Claim 16, before "the" delete "at least one of".

Column 24, Line 33, Claim 32, before "wall" delete "at least one".

Signed and Sealed this

Twenty-fourth Day of November, 2009

David J. Kappos
*Director of the United States Patent and Trademark Office*